United States Patent
Son et al.

(10) Patent No.: US 11,990,389 B2
(45) Date of Patent: May 21, 2024

(54) SEMICONDUCTOR PACKAGE INCLUDING EMBEDDED COOLING STRUCTURE

(71) Applicant: KOREA ADVANCED INSTITUTE OF SCIENCE AND TECHNOLOGY, Daejeon (KR)

(72) Inventors: Keeyoung Son, Daejeon (KR); Joung-Ho Kim, Daejeon (KR); Subin Kim, Daejeon (KR); Shinyoung Park, Daejeon (KR); Seungtaek Jeong, Daejeon (KR); Gapyeol Park, Daejeon (KR); Boogyo Sim, Daejeon (KR); Hyunwook Park, Daejeon (KR); Taein Shin, Daejeon (KR); Seongguk Kim, Daejeon (KR); Kyungjune Son, Daejeon (KR); Minsu Kim, Daejeon (KR)

(73) Assignee: Korea Advanced Institute Of Science And Technology, Daejeon (KR)

( * ) Notice: Subject to any disclaimer, the term of this patent is extended or adjusted under 35 U.S.C. 154(b) by 189 days.

(21) Appl. No.: 17/550,347

(22) Filed: Dec. 14, 2021

(65) Prior Publication Data

US 2023/0028887 A1    Jan. 26, 2023

(30) Foreign Application Priority Data

Jul. 26, 2021 (KR) .......................... 10-2021-0097545

(51) Int. Cl.
*H01L 23/473* (2006.01)
*H01L 23/373* (2006.01)
(Continued)

(52) U.S. Cl.
CPC ........ *H01L 23/473* (2013.01); *H01L 23/3736* (2013.01); *H01L 23/481* (2013.01);
(Continued)

(58) Field of Classification Search
CPC ................. H01L 23/473; H01L 23/481; H01L 2225/06541; H01L 2225/06589;
(Continued)

(56) References Cited

U.S. PATENT DOCUMENTS 7,990,711 B1 * 8/2011 Andry ................. H01L 25/0657
165/80.4
9,859,262 B1 * 1/2018 Patel ................... H01L 25/0657
(Continued)

FOREIGN PATENT DOCUMENTS

| JP | 2008-083043 A | 4/2008 |
| JP | 2014-175351 A | 9/2014 |
| KR | 10-1461819 B1 | 11/2014 |

OTHER PUBLICATIONS

Son, Keeyoung, et al., "Design and Analysis of Thermal Transmission Line based Embedded Cooling Structures for High Bandwidth Memory Module and 2.5D/3D ICs", Dec. 14-16, 2020, Virtual Conference by IEEE Electronic packaging Society (EPS).

*Primary Examiner* — Mamadou L Diallo
(74) *Attorney, Agent, or Firm* — Womble Bond Dickinson (US) LLP

(57) ABSTRACT

A semiconductor package includes an interposer, an electronic device having a first side surface and a second side surface opposite to the first side surface, and including a plurality of memory dies stacked in a vertical direction, at least one first through pipe passing through the electronic device in the vertical direction adjacent to the first side surface, and moving a cooling liquid therein, and a plurality of thermal transmission lines extending in a horizontal direction inside the memory die, and extending in parallel from the first through pipe toward the second side surface.

8 Claims, 7 Drawing Sheets

(51) Int. Cl.
*H01L 23/48* (2006.01)
*H01L 23/498* (2006.01)
*H01L 25/065* (2023.01)
*H01L 25/18* (2023.01)

(52) U.S. Cl.
CPC .... H01L 23/49822 (2013.01); H01L 25/0657 (2013.01); *H01L 25/18* (2013.01); *H01L 2225/06513* (2013.01); *H01L 2225/06517* (2013.01)

(58) Field of Classification Search
CPC .......... H01L 23/49822; H01L 25/0657; H01L 25/18; H01L 25/0655; H01L 23/5385
See application file for complete search history.

(56) References Cited

U.S. PATENT DOCUMENTS

| | | | |
|---|---|---|---|
| 11,688,665 B2* | 6/2023 | Eid | H01L 23/473 |
| | | | 257/713 |
| 2007/0085198 A1* | 4/2007 | Shi | H01L 25/18 |
| | | | 257/E23.098 |
| 2010/0124012 A1* | 5/2010 | Kondo | G06F 1/20 |
| | | | 361/679.47 |
| 2016/0360645 A1* | 12/2016 | Achard | H05K 7/2039 |
| 2020/0176357 A1* | 6/2020 | Yu | H01L 23/10 |
| 2020/0402888 A1* | 12/2020 | Tsutsui | H01L 25/0657 |
| 2021/0227724 A1* | 7/2021 | Li | H05K 7/20763 |
| 2021/0280761 A1* | 9/2021 | Kim | H01L 23/38 |
| 2023/0005883 A1* | 1/2023 | Kim | H01L 25/18 |
| 2023/0113726 A1* | 4/2023 | Kwak | H01L 25/0652 |
| | | | 257/696 |

\* cited by examiner

SEMICONDUCTOR PACKAGE INCLUDING EMBEDDED COOLING STRUCTURE

PRIORITY STATEMENT

This application claims priority under 35 U.S.C. § 119 to Korean Patent Application No. 10-2021-0097545, filed on Jul. 26, 2021 in the Korean Intellectual Property Office (KIPO), the contents of which are herein incorporated by reference in their entirety.

BACKGROUND

1. Field

Example embodiments relate to a semiconductor package. More particularly, example embodiments relate to a semiconductor package including a cooling device for solving heat generation problem.

2. Description of the Related Art

A microfluidic cooling system having a built-in cooling structure may be used as a cooling structure for an interposer-based high-performance 2.5-D/3-D ICs system. Because the microfluidic cooling system has a thickness of several hundreds of micrometers, there may be a limitation in that it may be applied only to an application processor (AP), an interposer, etc. having sufficient structural stability. In addition, because the 2.5-D/3-D ICs system includes an underfill section for each layer, although an off-chip section outside the semiconductor chip may be cooled, it may be difficulty in cooling due to low heat transfer in a vertical direction. Furthermore, when a cooling structure that moves a fluid inside the semiconductor chip is applied, there may be a problem of structural stability during a manufacturing process thereof.

SUMMARY

Example embodiments provide a semiconductor package including an electronic device having a thermal transmission line structure for improving heat transfer performance.

According to example embodiments, a semiconductor package includes an interposer, an electronic device arranged on the interposer having a first side surface and a second side surface opposite to the first side surface, the electronic device including a plurality of memory dies stacked in a vertical direction, at least one first through pipe passing through the electronic device in the vertical direction adjacent to the first side surface, the first through pipe moving a cooling liquid therein, and a plurality of thermal transmission lines extending in a horizontal direction in the memory die, the thermal transmission lines extending parallel with each other from the first through pipe toward the second side surface.

According to example embodiments, a semiconductor package includes an interposer, a first electronic device disposed on the interposer, a second electronic device disposed on the interposer and spaced apart from the first electronic device, the second electronic device having a first side surface and a second side surface opposite to the first side surface, the second electronic device including a plurality of memory dies stacked in a vertical direction, at least one first through pipe passing through the second electronic device in the vertical direction adjacent to the first side surface, the first through pipe moving a cooling liquid therein, a second through pipe provided through the interposer and the first electronic device and in fluid communication with the first through pipe to move the cooling liquid therein, and a plurality of thermal transmission lines provided in the memory die, the thermal transmission lines extending parallel with each other from the first through pipe toward the second side surface.

BRIEF DESCRIPTION OF THE DRAWINGS

Example embodiments will be more clearly understood from the following detailed description taken in conjunction with the accompanying drawings.

FIGS. 1 and 2 are cross-sectional views illustrating a semiconductor package in accordance with example embodiments.

FIG. 3 is a cross-sectional view taken along the line A-A' in FIG. 2.

FIG. 4 is a cross-sectional view taken along the line B-B' in FIG. 2.

FIGS. 5 to 7 are cross-sectional views illustrating various thermal transmission lines.

DETAILED DESCRIPTION OF EXAMPLE EMBODIMENTS

Figure 1:
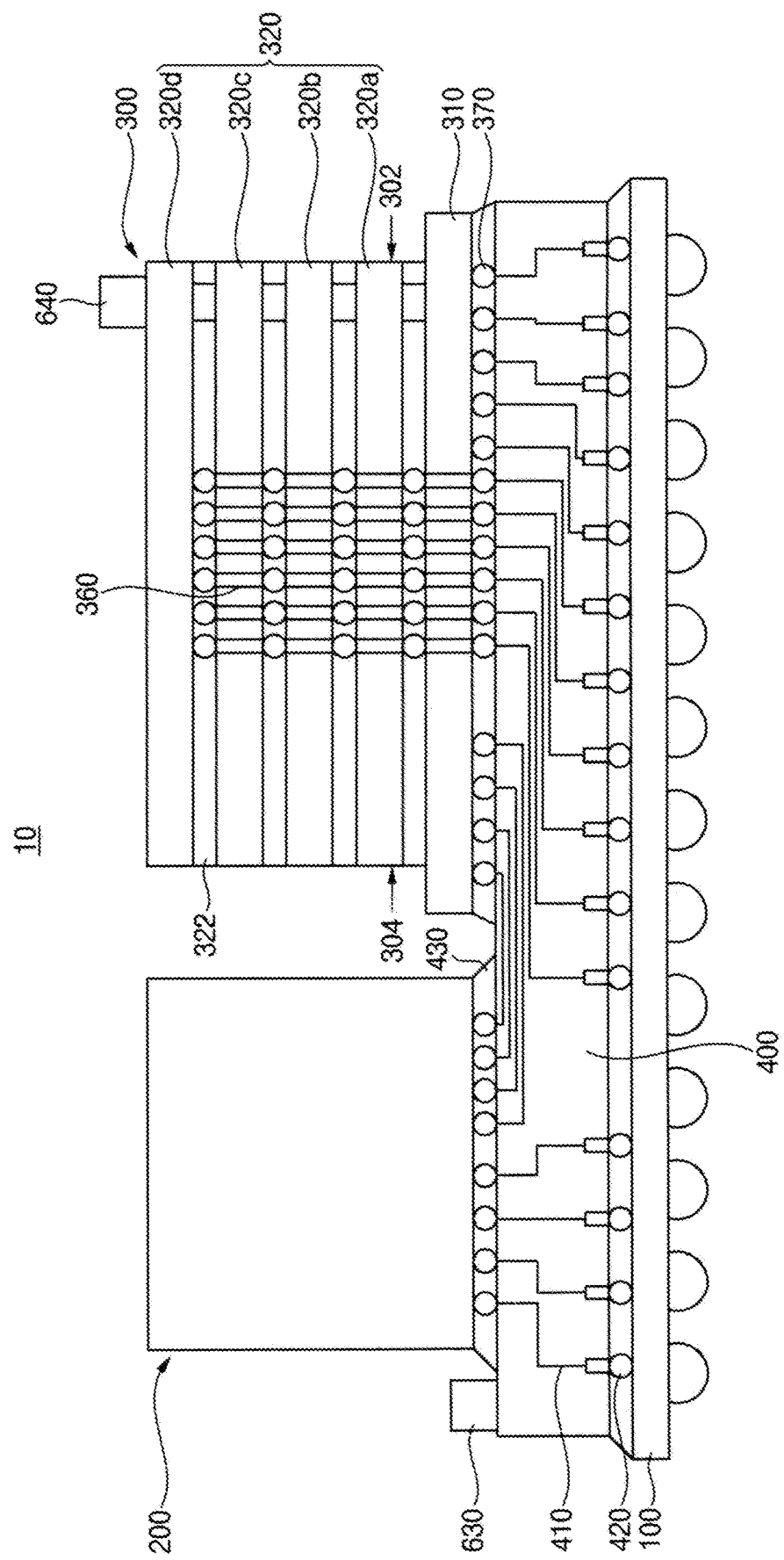
FIGS. 1 to 7 represent non-limiting, example embodiments as described herein.

Hereinafter, example embodiments will be explained in detail with reference to the accompanying drawings.

In the drawings, the sizes and relative sizes of components or elements may be exaggerated for clarity.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art.

Figure 2:
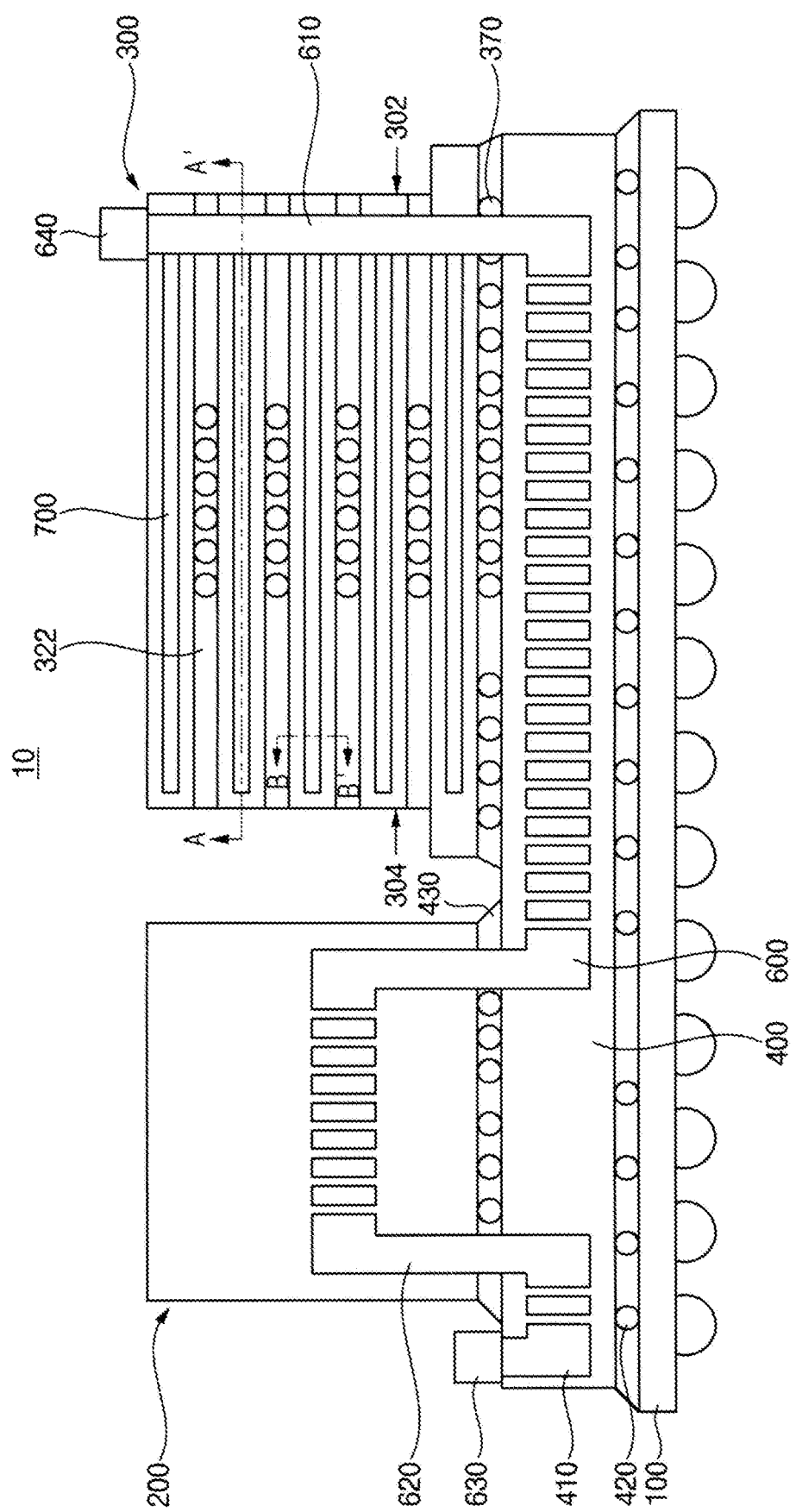
Figure 3:
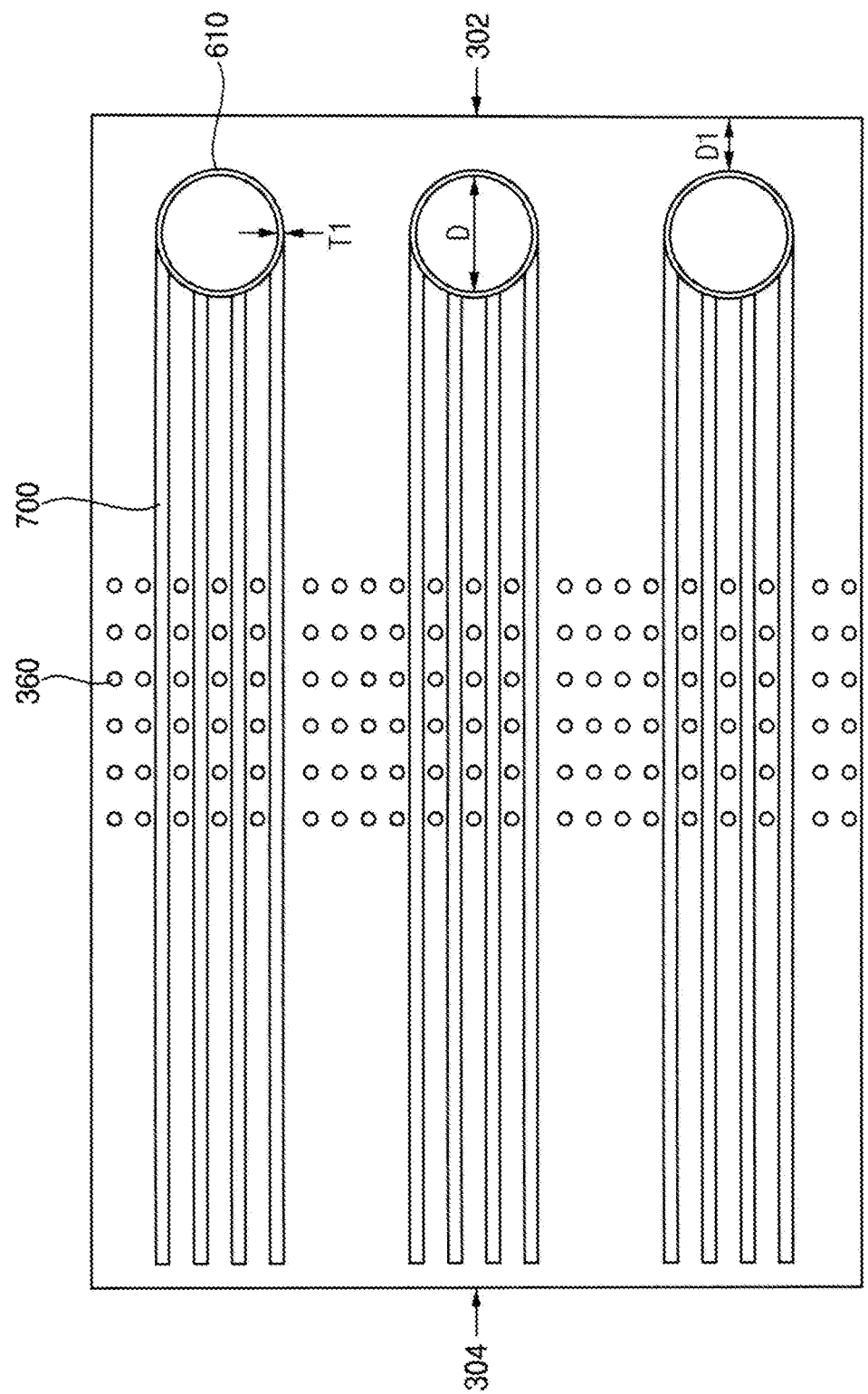
Figure 4:
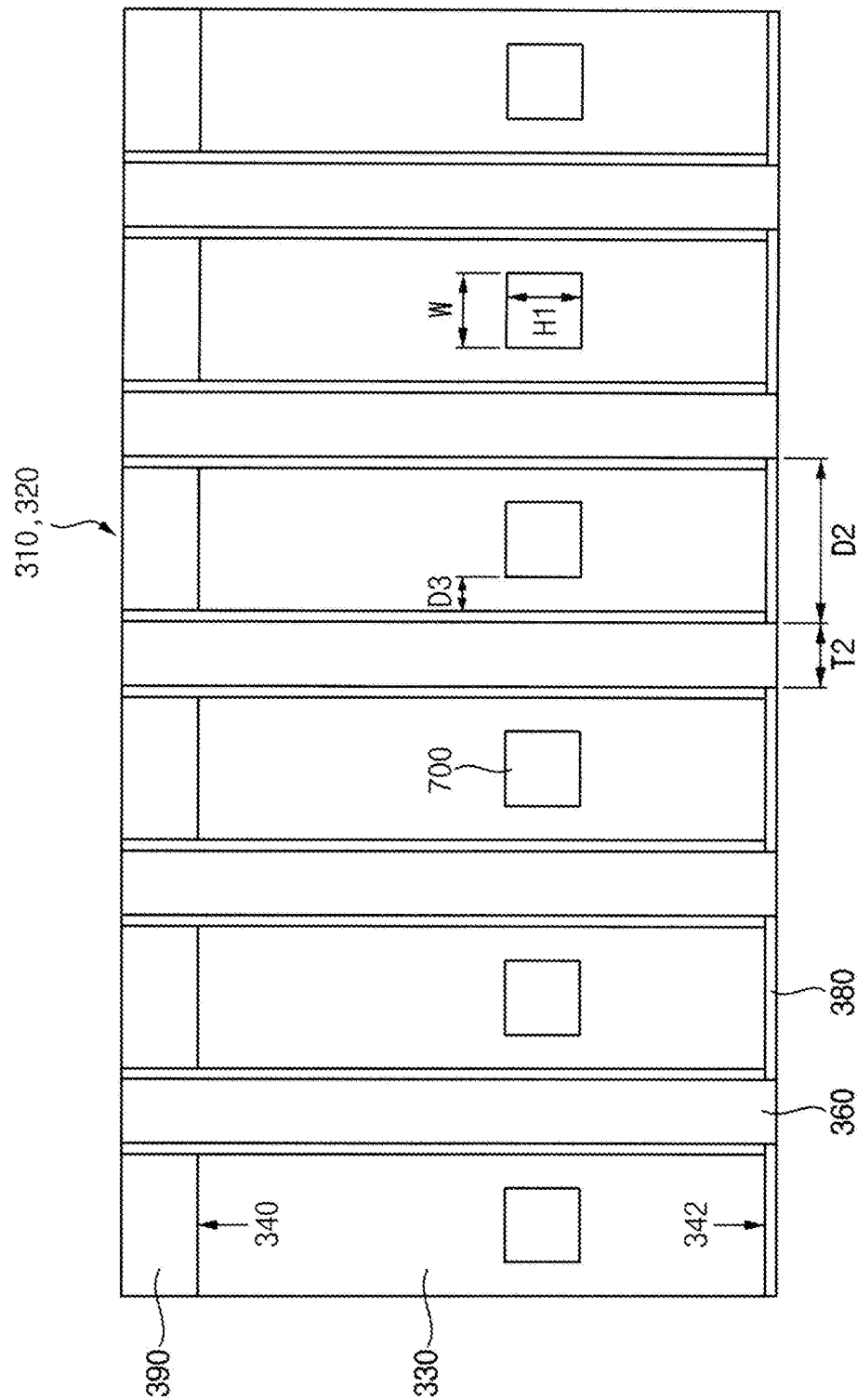

FIGS. 1 and 2 are cross-sectional views illustrating a semiconductor package in accordance with example embodiments. FIG. 3 is a cross-sectional view taken along the line A-A' in FIG. 2. FIG. 4 is a cross-sectional view taken along the line B-B' in FIG. 2.

Referring to FIGS. 1 to 4, a semiconductor package 10 may include a package substrate 100, a first electronic device 200 and a second electronic device 300 arranged respectively on the package substrate 100 and a cooling device 600 thermally coupled to the first and second electronic devices 200 and 300.

In example embodiments, the semiconductor package 10 may be a memory device having a stacked chip structure in which a plurality of dies (chips) may be stacked. For example, the semiconductor package 10 may include a semiconductor memory device with a 2.5D chip structure. The semiconductor package 10 including the memory device having the 2.5D chip structure may further include an interposer 400 for electrically connecting the first and second electronic devices 200 and 300.

In this case, the first electronic device 200 may include a logic semiconductor device, and the second electronic device 300 may include a memory device. The logic semiconductor device may be an ASIC as a host such as CPU, GPU and SoC. The memory device may include a high bandwidth memory (HBM) device. Alternatively, the semiconductor package 10 may include a semiconductor memory device having a 3D chip structure.

Hereinafter, the semiconductor package 10 as the semiconductor memory device having the 2.5D chip structure will be explained. However, it may be understood that the semiconductor package 10 according to example embodiments is not be limited to the semiconductor memory device having the 2.5D chip structure.

As illustrated in FIGS. 1 and 2, the semiconductor memory device may be mounted on the package substrate 100. The semiconductor memory device may include an ASIC 200 as the first electronic device and an HBM 300 as the second electronic device mounted on the interposer 400. The ASIC 200 and the HBM 300 may be arranged the interposer 400 to be spaced apart from each other. The HBM 300 may include a buffer die 310 serving as a circuit and a plurality of memory dies (chips) 310, 320a, 320b, 320c and 320d sequentially stacked on the buffer die 310.

The ASIC 200 may be mounted on the interposer 400 through solder bumps 370, and the buffer die 310 may be mounted on the interposer 400 through solder bumps 370. For example, the solder bumps 370 may include solder such as tin (Sn), tin/silver (Sn/Ag), tin/copper (Sn/Cu), or tin/indium (Sn/In). The buffer die 310 and the memory dies 320a, 320b, 320c and 320d may be electrically connected to each other by through silicon vias (TSVs) 360. The through silicon vias 360 may be electrically connected to each other by the solder bumps 370. The buffer die 310 and the memory dies 320 may communicate a data signal and a control signal through the through silicon vias 360.

Each of the buffer die 310 and the memory dies 320 constituting the second electronic device 300 may include a silicon substrate 330. The silicon substrate 330 may have a first surface 340 and a second surface 342 opposite to each other. Circuit patterns may be provided on the first surface 340 of the silicon substrate 330. The circuit pattern may include a transistor, a diode, or the like. The circuit pattern may be formed by a wafer process referred to as a front-end-of-line (FEOL) process.

A redistribution wiring layer 390 may be provided on the first surface 340 of the silicon substrate 330. The redistribution wiring layer 390 may be formed on the first surface 340 of the silicon substrate 330 by a wiring process referred to as a back-end-of-line (BEOL) process. The redistribution wiring layer 390 may include wirings therein. For example, the wirings may include aluminum (Al), copper (Cu), tin (Sn), nickel (Ni), gold (Au), platinum (Pt), or an alloy thereof.

The second electronic device 300 may have a first side surface 302 and a second side surface 304 that may be opposite to each other.

An underfill material layer 322 may be provided between the buffer die 310 and the memory dies 320. For example, the underfill material layer 322 may include a resin material such as epoxy resin or silicone resin.

The interposer 400 may include redistribution wirings 410 provided therein. The ASIC 200 and the HBM 300 may be connected to each other by the redistribution wiring 410 in the interposer 400 or may be electrically connected to the package substrate 100 by the conductive bumps 420.

In example embodiments, the cooling device 600 may include a plurality of first through pipes (Fluidic Through Silicon Via, F-TSV) 610 provided to penetrate through the second electronic device 300, a second through pipe 620 provided to penetrate through the first electronic device 200 and the interposer 400, an inlet portion 630, and an outlet portion 640.

The cooling device 600 may be provided to penetrate through the first electronic device 200, the second electronic device 300 and the interposer 400 of the semiconductor package 10, and may absorb heat generated inside the semiconductor package 10. The cooling device 600 may be provided at a position where it would be installed inside the semiconductor package 10 without limitation. The cooling device 600 may lower the temperature inside the semiconductor package 10, thereby improving the efficiency of the semiconductor package 10.

The first through pipes 610 may be provided to vertically penetrate through the second electronic device 300. The first through pipes 610 may be provided to sequentially pass through the buffer die 310 and the memory dies 320a, 320b, 320c, and 320d. The first through pipes 610 may be provided at regular intervals along the first side surface 302 of the second electronic device 300.

The first through pipes 610 may be provided to be spaced apart from the first side surface 302 by a predetermined first distance D1. The first distance D1 may be within a range of 150 μm to 250 μm. The first through pipes 610 may have a cylindrical shape and have a diameter D within a range of 100 μm to 140 μm. The first through pipes 610 may have a thickness T1 within a range of 5 μm to 20 μm.

The first through pipe 610 may have a pipe shape having a space for the fluid to move therein. For example, the first through pipe 610 may include at least one selected from the group consisting of copper, aluminum, tungsten, gold and silver. Alternatively, the first through pipe 610 may include titanium nitride, titanium, iron, tungsten, platinum, iron-nickel alloy, silicon oxide or alloys thereof.

The first through pipe 610 may move a cooling liquid therein. The first through pipe 610 may receive the cooling liquid from the second through pipe 620. The first through pipe 610 may discharge the cooling liquid to the outside of the semiconductor package 10 through the outlet portion 640.

The second through pipe 620 may be provided to pass through the inside of the first electronic device 200 and the interposer 400, and may absorb heat generated inside the semiconductor package 10. The second through pipe 620 may be provided without limitation at an installable position depending on the type of the semiconductor package 10.

The second through pipe 620 may receive the cooling liquid from the inlet 630. For example, the cooling liquid may include at least one selected from DI Water, ethanol, methanol, and ammonia.

The second through pipe 620 may include at least one selected from copper, aluminum, tungsten, gold, and silver. Alternatively, the second through pipe 620 may be made of titanium nitride, titanium, iron, tungsten, platinum, iron-nickel alloy, silicon oxide or alloys of any of these materials.

The inlet portion 630 may be provided to be in fluid communication with the second through pipe 620. For example, the inlet portion 630 may be provided on the interposer 400. Alternatively, the inlet portion 630 may be provided without limitation at an installable position depending on the type of the semiconductor package 10. The inlet portion 630 may be connected to a cooling liquid providing pump provided outside the semiconductor package 10 to continuously receive the cooling liquid.

The outlet portion 640 may be provided on the second electronic device 300. The outlet portion 640 may be provided on the memory die 320d installed in the uppermost layer among the memory die 320 constituting the second electronic device 300. The outlet portion 640 may discharge the cooling liquid used inside the cooling device 600 to the outside. The cooling liquid discharged through the outlet portion 640 may be recovered by the cooling liquid providing pump. The cooling liquid providing pump may introduce the recovered cooling liquid into the inlet portion 630, thereby circulating the cooling liquid into the semiconductor package 10. The cooling liquid providing pump may supply and recover the cooling liquid to the plurality of semiconductor packages, thereby lowering the overall temperature of the entire system in which the semiconductor package 10 is installed.

In example embodiments, the cooling device 600 may further include a plurality of thermal transmission lines (TTL) 700. The thermal transmission lines 700 may be provided in the buffer die 310 and the memory dies 320. The thermal transmission lines 700 may be provided respectively in the buffer die 310 and the memory die 320 to extend from the first side surface 302 to the second side surface 304 in a horizontal direction parallel with a surface of the second electronic device 300.

The thermal transmission lines 700 may be provided to contact the first through pipe 610. For example, the first through pipe 610 provided inside one memory die 320 may be provided in contact with three to five thermal transmission lines 700. The plurality of thermal transmission lines 700 may extend parallel with each other.

The thermal transmission lines 700 may be provided between the plurality of through silicon vias 360. For example, the through silicon via 360 may have a thickness T2 within a range of 4 μm to 6 μm. The through silicon vias 360 may be spaced apart from each other by a second distance D2 within a range of 35 μm to 45 μm.

The thermal transmission lines 700 may have a rectangular cross-section. For example, the thermal transmission lines 700 may have a thickness W within a range of 3 μm to 12 μm. The thermal transmission line 700 may have a height H1 within a range of 3 μm to 12 μm. The thermal transmission line 700 and the through silicon via 300 may be spaced apart from each other by a third distance D3 within a range of 7 μm to 15 μm.

For example, the thermal transmission lines 700 may be made of the same material as the first through pipe 610. The thermal transmission lines 700 may include at least one selected from copper, aluminum, tungsten, gold, and silver. Alternatively, the thermal transmission lines 700 may be made of titanium nitride, titanium, iron, tungsten, platinum, iron-nickel alloy, silicon oxide or alloys of any of these materials.

As described above, the thermal transmission lines 700 provided in the memory die 320 of the second electronic component 300 may receive heat from a shorter distance than the through silicon via 360 and radiate heat through the first through pipe 610 to cool the memory die 320. In addition, the first through pipe 610 and the thermal transmission lines 700 may reduce heat transfer from the second electronic device 300 to the peripheral semiconductor devices and eliminate or reduce the heat problem of the entire system.

Figure 5:
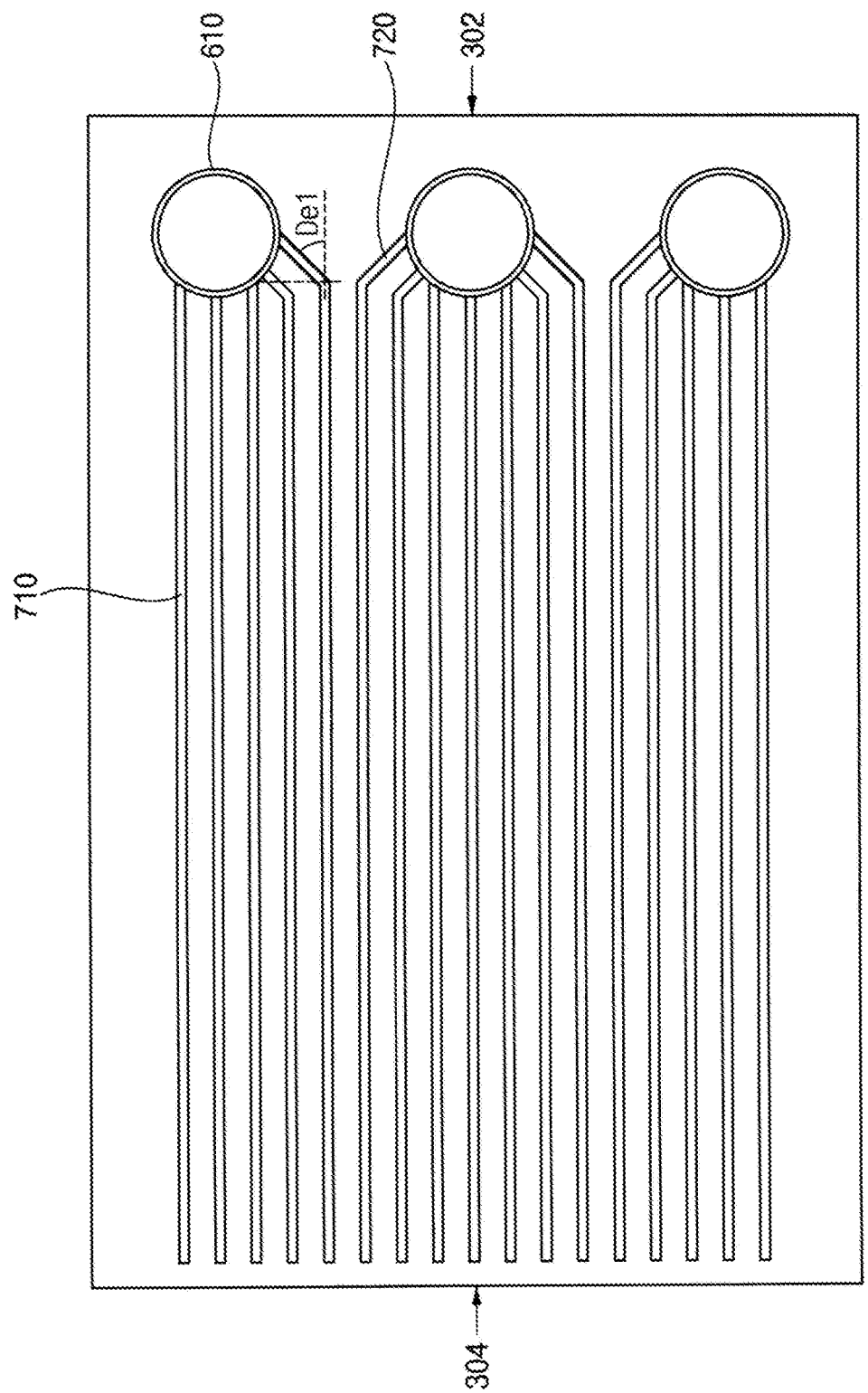
Figure 6:
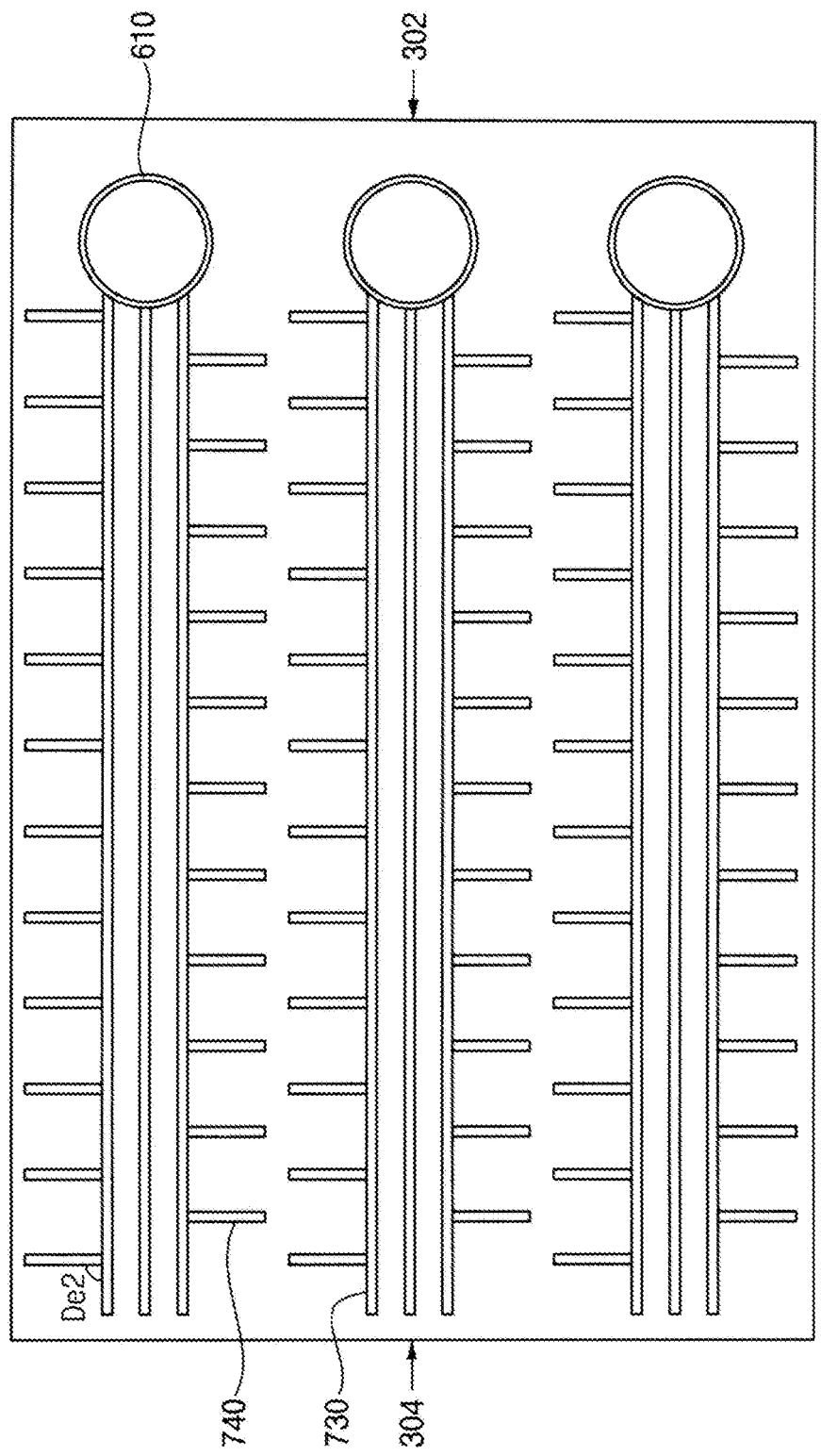
Figure 7:
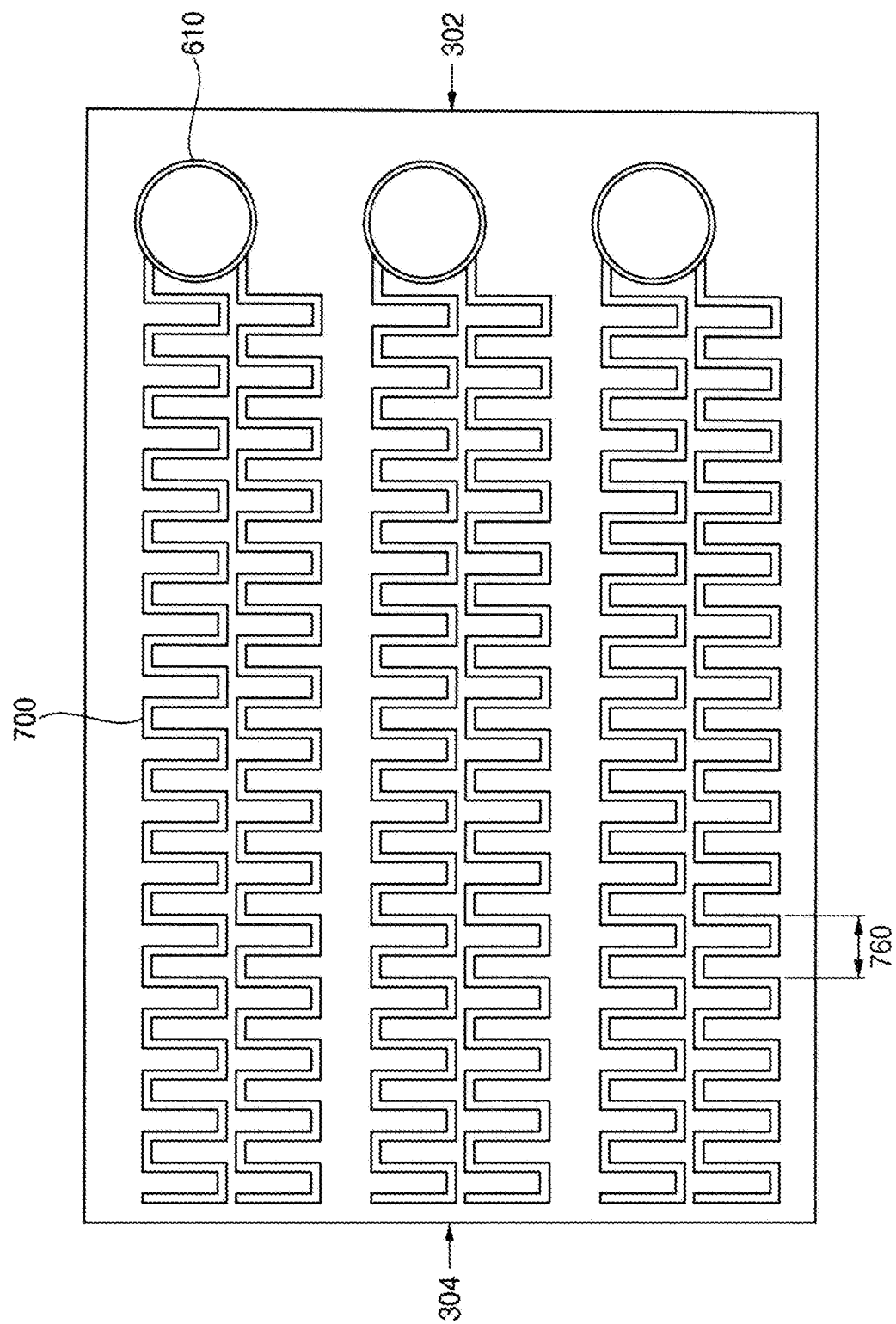

FIGS. 5 to 7 are cross-sectional views illustrating various thermal transmission lines.

Referring to FIG. 5, the thermal transmission lines 700 may include a plurality of first thermal transmission lines 710 and a plurality of second thermal transmission lines 720.

The thermal transmission lines 700 may be provided inside the buffer die 310 and the memory dies 320. Each of the thermal transmission lines 700 may be provided respectively in the buffer die 310 and the memory die 320 to extend from the first side surface 302 to the second side surface 304 in a horizontal direction parallel with a surface of the second electronic device 300.

The first thermal transmission lines 710 may be provided to be in direct contact with the first through pipe 610. The first thermal transmission lines 710 may extend parallel with each other from the first through pipe 610 toward the second side surface 304. For example, three to seven first thermal transmission lines 710 may be provided to be in contact with one first through pipe 610 provided inside one memory die 320. The first thermal transmission lines 710 may extend parallel with each other.

In example embodiments, the thermal transmission lines 720 may extend from the first through pipe 610 toward the second side surface 304. The second thermal transmission line 720 may have one end portion bent at a preset angle Del. The second thermal transmission line 720 may be provided with one end of the bent shape in contact with the first through pipe 610. The angle Del may be within a range of 0 degrees to 90 degrees. The thermal transmission line 700 with the second thermal transmission lines 720 may have a large heat absorbing area.

Referring to FIG. 6, the thermal transmission lines 700 may include a plurality of third thermal transmission lines 710 and a plurality of fourth thermal transmission lines 720.

The third thermal transmission lines 730 may be provided to be in direct contact with the first through pipe 610. The third thermal transmission lines 730 may extend parallel with each other from the first through pipe 610 toward the second side surface 304. For example, three to seven third thermal transmission lines 730 may be provided to be in contact with one first through pipe 610 provided inside one memory die 320. The third thermal transmission lines 730 may extend parallel with each other.

In example embodiments, the fourth thermal transmission lines 740 may extend from the third thermal transmission line 730 in a direction perpendicular to the extending direction of the third thermal transmission line 730. The fourth thermal transmission lines 740 may be provided to be in contact with the third thermal transmission lines 730 located relatively outside of the third thermal transmission lines 730. The fourth thermal transmission lines 740 may be parallel with each other. The fourth thermal transmission lines 740 may be arranged at preset intervals to be spaced apart from each other. The thermal transmission line 700 with the fourth thermal transmission line 740 may have a large heat absorbing area.

Referring to FIG. 7, the thermal transmission lines 700 may have a meander structure. The meander structure may have a structure in which the heat transmission line 700 extends in a zigzag manner.

In the meander structure, a unit 760 in which the thermal transmission lines 700 proceed in the zigzag is repeated two or more times. That is, the unit 760 in which the thermal transmission line 700 forms a zigzag and proceeds two-dimensionally in a predetermined direction may be repeated two or more times inside the buffer die 310 or memory die 320. The two directions constituting the zigzag of the unit 760 may form an angle of 180 degrees or may have an obtuse angle within 180 degrees.

As described above, the thermal transmission line 700 provided in the memory die 320 of the second electronic device 300 may receive heat from a shorter distance from the through silicon via 360 and radiate heat through the first through pipe 610 to cool the memory die 320. In addition, the first through pipe 610 and the thermal transmission line 700 may prevent or reduce heat from the second electronic device 300 from being transferred to surrounding semiconductor devices, thereby eliminating or reducing the heat problem of the entire system.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:
an interposer;
an electronic device arranged on the interposer having a first side surface and a second side surface opposite to the first side surface, the electronic device including a plurality of memory dies stacked in a vertical direction;
at least one first through pipe passing through the electronic device in the vertical direction adjacent to the first side surface, the first through pipe moving a cooling liquid therein;
a second through pipe passing through the interposer and in fluid communication with the first through pipe to move the cooling liquid therein;
an inlet portion in fluid communication with the second through pipe to introduce the cooling liquid;
an outlet portion disposed on the electronic device and in fluid communication with the first through pipe to discharge the cooling liquid to the outside; and
a plurality of thermal transmission lines extending in a horizontal direction in each of the memory dies, the thermal transmission lines extending parallel with each other from the first through pipe toward the second side surface.

2. The semiconductor package of claim 1, wherein the electronic device further includes a through silicon via penetrating through the memory dies in the vertical direction and transmitting an electrical signal, and
a distance between the thermal transmission line and the through silicon via is within a range of 7 μm to 15 μm.

3. The semiconductor package of claim 1, wherein the thermal transmission line includes at least one of copper, aluminum, tungsten, gold, and silver.

4. The semiconductor package of claim 1, wherein the thermal transmission line has a cross section of a rectangular shape, and the rectangular shape has a thickness within a range of 3 μm to 12 μm.

5. The semiconductor package of claim 1, wherein the thermal transmission line further includes:
a plurality of first thermal transmission lines extending parallel with each other from the first through pipe toward the second side surface; and
a plurality of second thermal transmission lines extending from the first through pipe toward the second side surface and having one end bent at a predetermined angle to be in contact with the first through pipe.

6. The semiconductor package of claim 1, wherein the thermal transmission line further includes:
a plurality of third thermal transmission lines extending parallel with each other from the first through pipe toward the second side surface; and
a plurality of fourth thermal transmission lines extending from the third thermal transmission line in a direction perpendicular to the extending direction of the third thermal transmission line.

7. The semiconductor package of claim 1, wherein the thermal transmission lines have a meander structure extending in a zigzag manner with a repeating constant unit.

8. A semiconductor package, comprising:
an interposer;
a first electronic device disposed on the interposer;
a second electronic device disposed on the interposer and spaced apart from the first electronic device, the second electronic device having a first side surface and a second side surface opposite to the first side surface, the second electronic device including a plurality of memory dies stacked in a vertical direction;
at least one first through pipe passing through the second electronic device in the vertical direction adjacent to the first side surface, the first through pipe moving a cooling liquid therein;
a second through pipe provided through the interposer and the first electronic device and in fluid communication with the first through pipe to move the cooling liquid therein;
an inlet portion in fluid communication with the second through pipe to introduce the cooling liquid;
an outlet portion disposed on the electronic device and in fluid communication with the first through pipe to discharge the cooling liquid to the outside; and
a plurality of thermal transmission lines provided in each of the memory dies, the thermal transmission lines extending parallel with each other from the first through pipe toward the second side surface.

* * * * *